(12) United States Patent
Ruckerbauer et al.

(10) Patent No.: US 7,050,340 B1
(45) Date of Patent: May 23, 2006

(54) SEMICONDUCTOR MEMORY SYSTEM AND METHOD FOR THE TRANSFER OF WRITE AND READ DATA SIGNALS IN A SEMICONDUCTOR MEMORY SYSTEM

(75) Inventors: Hermann Ruckerbauer, Moos (DE); Dominique Savignac, Ismaning (DE); Christian Sichert, München (DE); Peter Gregorius, München (DE); Paul Wallner, Prien (DE)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 10/986,767

(22) Filed: Nov. 15, 2004

(51) Int. Cl.
*G11C 7/00* (2006.01)
(52) U.S. Cl. ............. 365/191; 365/189.12; 365/189.08
(58) Field of Classification Search ................ 365/191, 365/189.08, 189.12
See application file for complete search history.

(56) References Cited

U.S. PATENT DOCUMENTS

| | | | |
|---|---|---|---|
| 6,724,685 B1* | 4/2004 | Braun et al. ................ | 365/194 |
| 2002/0023191 A1* | 2/2002 | Fudeyasu .................... | 711/104 |
| 2003/0123320 A1* | 7/2003 | Wright et al. .......... | 365/189.05 |

\* cited by examiner

*Primary Examiner*—Tuan T. Nguyen
(74) *Attorney, Agent, or Firm*—Edell, Shapiro & Finnan, LLC

(57) ABSTRACT

A semiconductor memory system for the transfer of write and read data signals among interface circuits includes at least one memory device, a memory controller unit and, optionally, a register unit of a semiconductor memory system, wherein the data signals are each transferred in signal bursts of a specific burst length. The system is characterized in that a number of additional bits extending the burst length are transferred together with at least every $n^{th}$ signal burst.

19 Claims, 3 Drawing Sheets

SEMICONDUCTOR MEMORY SYSTEM AND METHOD FOR THE TRANSFER OF WRITE AND READ DATA SIGNALS IN A SEMICONDUCTOR MEMORY SYSTEM

FIELD OF THE INVENTION

The present invention relates to a semiconductor memory system. More particularly, the present invention relates to a semiconductor memory system with at least one memory device, a memory controller unit and, an optional register unit. Each of these components comprises an interface circuit and a method for the transfer of write and read data signals among the interface circuits, the data signals each being transferred in signal bursts of a specific burst length.

DESCRIPTION OF THE RELATED ART

At present, a separate ECC-module that can detect and possibly correct a channel error or a data error resulting from a DRAM error is provided for the detection or correction of errors in memory modules that are equipped with high-speed semiconductor memory devices. Typically, however, conventional DIMM memory modules for desktop personal computers do not have the capability to detect and correct errors. An additional further module for the detection and/or correction of errors that is not used for the storing of data would excessively increase the cost of such a system.

In conventional semiconductor memory systems, the clock recovery for a received data signal is achieved by transmitting an additional strobe signal, the so-called DQS signal, or by transmitting a synchronization burst via the data bus, because the semiconductor memory devices require a specific number of edge changes within a specific time interval to recover the clock cycle required for signal synchronization. Since it might collide with read data or write data, the synchronization burst disturbs the data traffic on the bus, and using the transfer of the separate DQS signal for synchronization is always difficult if data transfer rates are high.

The increased data transfer speeds of future generations of DRAMs will require a differential transfer of the data signals, which would almost double the number of pins on the memory module and at the module of the memory controller. Since, however, such a doubling of the pin number is impossible (routing, connector pin count, DRAM ball count, MCH ball count), employing an additional increase in transfer speed is an option. In this case, however, it is absolutely necessary that a capability of detecting and/or correcting errors be provided.

SUMMARY OF THE INVENTION

Accordingly, the present invention aims at facilitating a semiconductor memory system of the aforementioned type and a method for the transfer of write and read data signals among the interface circuits in such a semiconductor memory system, wherein the detection and/or correction of errors at least in the write data signals transferred is achieved without an increase in the number of pins on the semiconductor memory module and/or the memory controller. Additionally, it is possible to synchronize symbols without having to transfer an additional synchronization burst via the bus.

According to one aspect of the invention, a semiconductor memory system with at least one memory device comprises a memory controller unit and, optionally a register unit, each of which comprise an interface circuit, and with data transfer lines that run among the interface circuits and can each be used to transfer write and read data signals to and from the memory device from and to the memory controller unit and, optionally, from and to the register unit in signal bursts of a specific burst length.

According to an additional aspect of the invention, the interface circuits are adapted for the transfer of additional bits extending the burst length at least of the write data bursts together with at least every $n^{th}$ signal burst. This extension of the burst length proposed according to an aspect of the present invention allows the additional bits to be used as information on the detection or correction of errors. This design is of additional advantage in that it provides more time for the transfer of command and address information per burst and that, in a memory system with a point-to-point transfer of CA signals (what is called a P2P CA system), it is now, for example, possible to transfer 20 bits per burst per lane. This reduces the necessary number of CA lanes and the number of pins. Since it is important that a predetermined number of CA-commands can be transmitted through a P2P-CA-bus, the extended DQ burst length influences also the transmission on the CA-bus so that more information per burst can be transmitted.

It is to be noted that the read data may be treated only by an error detection algorithm, wherein the memory controller unit in case of a read error can simply repeat the read operation. Therefore, the extension of the burst length by means of the additional bits may be handled differently for write data and read data bursts so that more additional bits are included in the write data than in the read data bursts. The latter also includes a method wherein only the write data bursts are extended and not the read data bursts. However, it may simplify the circuit design of the interface circuits if the number of the additional bits is made equal for data read and write bursts.

Furthermore, an additional aspect of the present invention allows the burst length to, for example, 20 bits and uses all or some of the additional bits as synchronization patterns. This permits easy compensation of the overhead caused by the increased operating speed of the interface. What is more, there is no additional synchronization burst that might collide with the write and/or read request burst.

Thus, the measure proposed by the method according to the invention of extending the burst length by a number of additional bits that can be used as an ECC pattern and/or as a synchronization pattern, can, on the one hand, achieve in the semiconductor memory system according to the invention an effective error detection and/or correction algorithm and, on the other hand, a simplified symbol synchronization that can do without the transfer of a DQS signal or an additional synchronization burst.

In the semiconductor memory system according to the present invention, the additional bits are, preferably, transferred with each signal burst and typically in the same number.

For the purpose of detecting and/or correcting errors, the additional bits contain an error detection and/or correction code concerning the assigned data unit. If, for example, 128 data bits plus 32 additional bits are transferred via an X8 interface in such a semiconductor memory system, 32 bits are available for error correction, thus facilitating a quite effective error correction algorithm. Even if two additional bits are transferred with each burst, it is possible to achieve a highly effective error correction.

In the semiconductor memory system according to the invention, it is, furthermore, preferably provided that the additional bits contain a specific minimum number of edge changes for symbol synchronization. Moreover, the additional bits can form a specific synchronization pattern so that this information can be used on the DRAM memory chip, the memory controller module or the register for symbol synchronization by a clock data recovery circuit (CDR circuit).

As a matter of course, it is possible to combine the two proposed applications of the additional bits, that is, on the one hand, as error detection and/or correction bits and, on the other, as synchronization bits.

The above and further aims and elements of the invention are illustrated in more detail in the description below and in relation to the enclosed figures.

The above and still further aspects, features and advantages of the present invention will become apparent upon consideration of the following detailed description of a specific embodiment thereof, particularly when taken in conjunction with the accompanying drawings wherein like reference numerals in the various figures are utilized to designate like components.

DETAILED DESCRIPTION

Figure 1:
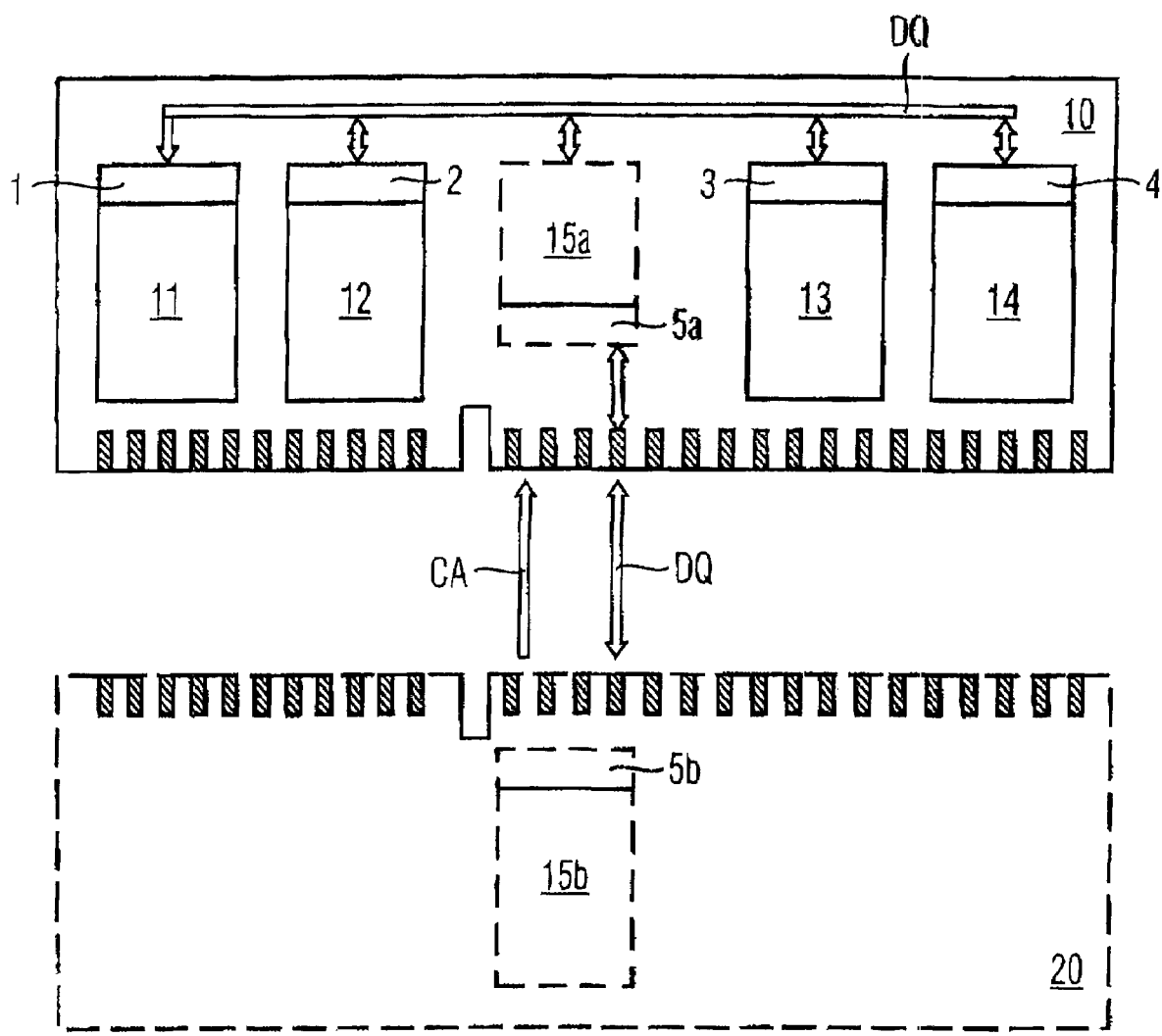
FIG. 1 is a schematical view of a semiconductor memory system according to an embodiment of the present invention, comprising a semiconductor memory module and a memory controller module.
Figure 2:
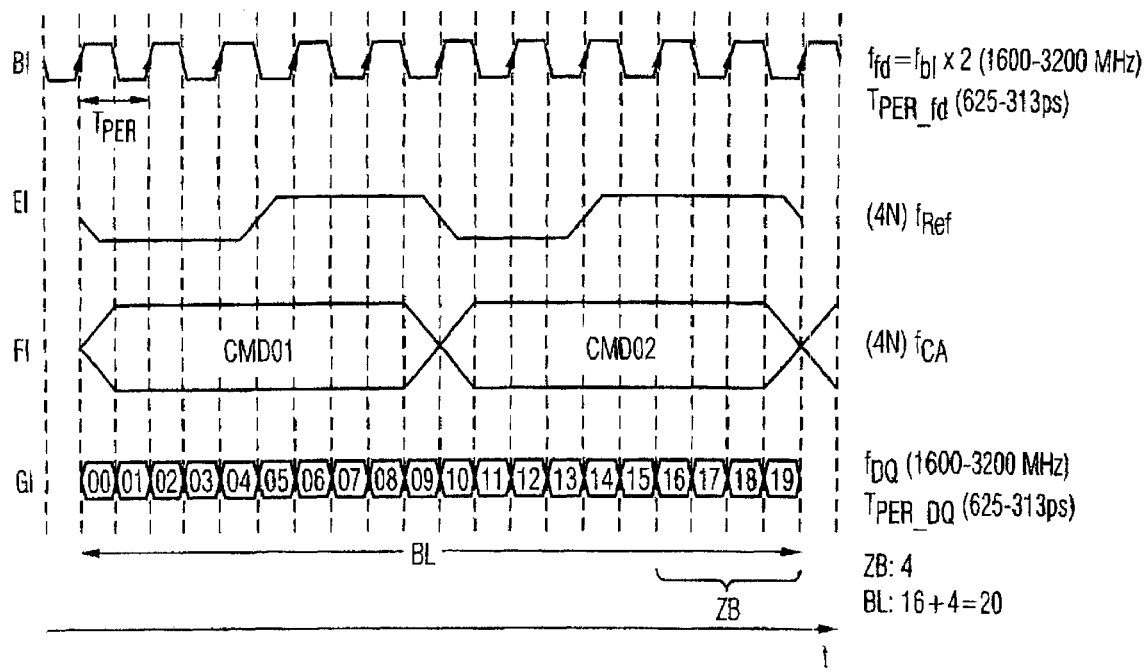
FIG. 2 illustrates a graphical signal-time diagram according to a preferred method of the present invention for the transfer of write and read data signals in the semiconductor memory system.
Figure 3:
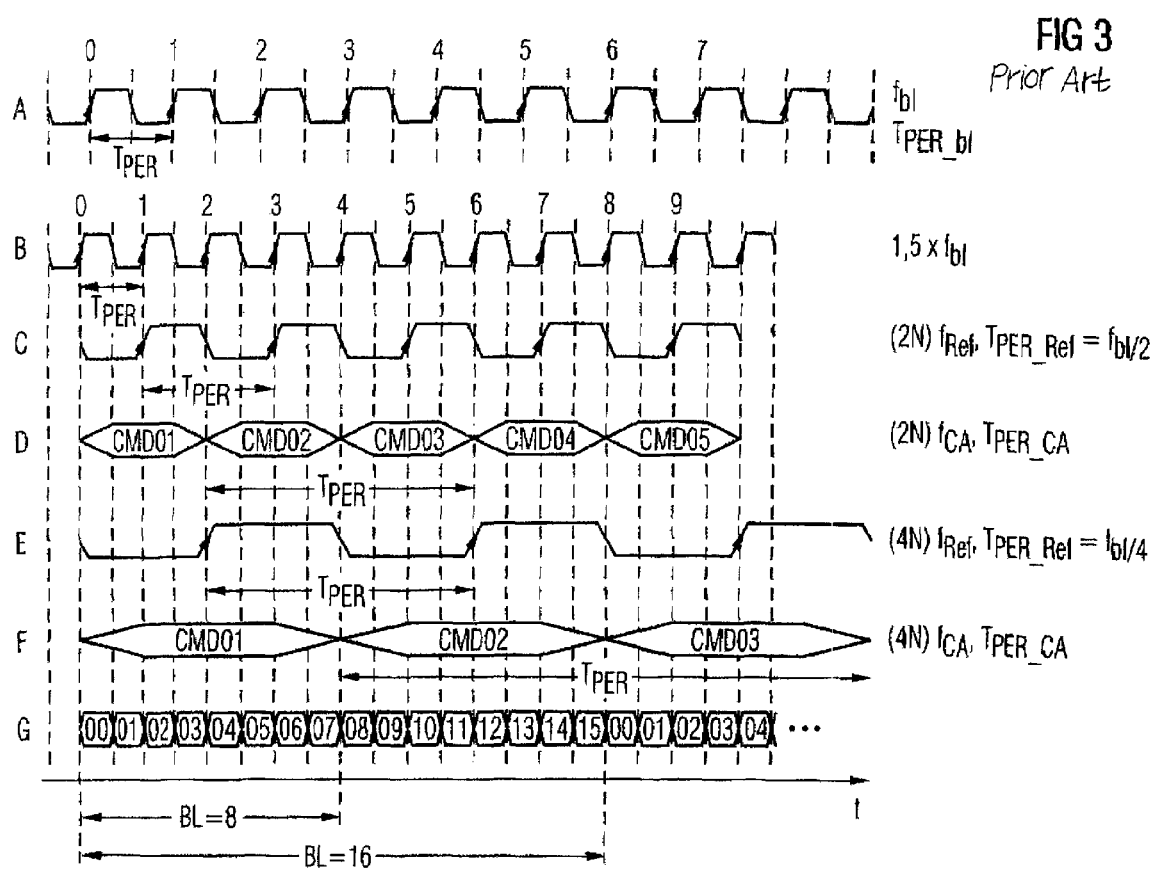
FIG. 3 shows a graphical signal-time diagram of a conventional method for the transfer of write and read data signals in a semiconductor memory system.

The following illustration of a preferred embodiment of the invention by means of FIGS. 1 and 2 will be preceded by a description of the prior art signal-time diagram of FIG. 3 illustrating a conventional method for the transfer of write and read data signals. According to this transfer method and on the basis of the fundamental clock of the frequency $f_{bl}$ shown in the first line A, for example within a frequency range $f_{bl}$=800–1600 MHz corresponding to a period length $P_{PR\_bl}$ of 1250–625 ps, and a fundamental clock of the frequency $1.5 \times f_{bl}$ that is shown in the second line B and is immediately derived from the fundamental clock according to line A, for example within a frequency range of 1333–2400 MHz corresponding to a period length of 750–416 ps, either a reference clock $f_{ref}$ with a period length $T_{per\_ref}$ that is shown in the third line C is generated according to a "2N" rule which means that a CA unit interval is twice the period length of the fundamental clock according to the second line B. Alternatively, the reference clock cycle (4N) $f_{ref}$ with a period length $T_{per\_ref}$ that is shown in the fifth line E is generated according to a "4N" rule which means that the CA unit interval is four times the period length of the basic clock cycle shown in the second line of FIG. 3. Either the reference clock $f_{ref}$ according to line C or the reference clock according to line E each specify the CA unit interval $T_{per\_CA}$ specified in the lines D and F respectively, either according to the "2N" rule or according to the "4N" rule.

The bottommost line G illustrates the "normal" 16 bits of the data transfer burst with a burst length BL=16 or, if the 2N rule is used, a data transfer burst of a burst length BL=8, occurring in a period $T_{per\_CA}$ of each of the CMD signals, such as they are represented in the forth line D and in the sixth line F respectively of FIG. 3. FIG. 1 will be used to describe below a preferred embodiment of a semiconductor memory system according to a preferred embodiment of the present invention and FIG. 2 to describe its mode of operation and a preferred example of the method according to the invention. A semiconductor memory module 10 that may, for example, be a DIMM memory module contains, for example, four memory devices 11, 12, 13, 14 and, optionally, a (dashed) register unit 15a, each with interface circuits 1, 2, 3, 4, and 5a. Here, it must be mentioned that, instead of on the semiconductor memory module, the register unit 15a may also be arranged on a memory controller module 20, in this case being referenced as 15b and the interface circuit of that register unit (15b) being referenced 5b. Command and address signals (CA) are transmitted from the memory controller 20 to the memory module 10 via a CA line system. Write and read data signals DQ are transferred from the memory controller 20 to the memory devices 11–14 arranged on the memory module 10 and from these memory devices 11–14 to the memory controller module 20 via a DQ line system. A DQ line system is also provided on the memory module 10 for the write and read data to be transferred.

As has already been mentioned, the present invention can employ the interface circuits 1–4, 5a (alternatively 5b) can be adapted for the transfer of additional bits extending the burst length at least of the write data together with at least every $n^{th}$ data signal burst. In the preferred embodiment, these additional bits are added to the read and write data signal bursts and can be used to detect and/or correct errors and/or to achieve a symbol synchronization in the particular receiving interface circuit.

Thus, according to the invention, 2 or 4 additional bits are, for example, added, extending the burst length to 10 or 20 respectively, in contrast to the conventional burst length of 8 or 16 bits, as illustrated above by means of FIG. 3. As a matter of course, burst lengths of, for example, 40 or 70 etc. are possible, that is in general burst lengths (including the additional bits) of $2^k+x$, with $2^k$ being the burst length without additional bits and x the number of additional bits.

However, as already described above, the extension of the burst length may be handled differently for write and read data bursts.

The error detection and/or correction information provided by the additional bits can be used per lane or per burst. For example, 32 bits are available for error correction measures if 4 additional bits are transferred per burst and a total of 160 bits are transferred per burst via an X8 interface. This permits a highly effective error correction. With this transfer method, even two additional bits would permit a highly effective error correction.

Furthermore, the additional bits that are added to the usual burst length allow a clock signal synchronization on reception of the data signals DQ in the particular interface circuits, thus making a separate transfer of synchronization bursts unnecessary.

In FIG. 2, a signal-time diagram illustrates how the burst length (e.g. BL=16) that is extended by the additional bits ZB is, in principle, generated in the interface circuits 1–4, 5a, optionally 5b in FIG. 1. Herein, FIG. 2 shows the signals of FIG. 3 in part only and not as a whole.

The fundamental clock $f_{fd}$ represented in the first line BI of FIG. 2 has been generated by doubling the frequency of the fundamental clock shown in line A of FIG. 3, so that now a burst length BL of altogether 20 bits with 4 additional bits can, for example, be accommodated in the double period $2 \times T_{per}$ of the reference clock shown in the second line EI for the "4N" rule or in the period $T_{per}$ of the CA signal for the "4N" rule that is shown in the third line FI of FIG. 2. These 20 bits of the burst extended in this manner are shown in the last line GI of FIG. 2. Assuming that, in the example, the fundamental clock of the frequency $f_{bl}$ is 800–1600 MHz (line A in FIG. 3), the clock frequency of the fundamental clock $f_{fd}$ according to line BI of FIG. 2 is twice as high, i.e. 1600–3200 MHz, corresponding to a period length $T_{per\_fd}$ of 625–313 ps, and the data transfer frequency achieved by the data signal burst of the bit length BL=20 is then 1600–3200 MHz.

The frequencies and period lengths specified are only an example and cannot be considered as limiting the invention. The number of additional bits and the total bit length BL are, likewise, only an example.

Having described preferred embodiments of a new and improved method and apparatus for the transfer of write and read data signals in a semiconductor memory system, it is believed that other modifications, variations, and changes will be suggested to those skilled in the art in view of the teachings set forth herein. It is therefore to be understood that all such variations, modifications and changes are believed to fall within the scope of the present invention as defined by the appended claims.

LIST OF REFERENCE SYMBOLS

1–4, 5a, 5b Interface circuits
10 Semiconductor memory module
11–14 Semiconductor memory devices
15a, 15b Register units
DQ Write and read data signals
CA Command and address signals
$f_{bl}$, $T_{PER\_bl}$ Frequency and period length of the fundamental clock (line A)
1.5 times $f_{bl}$ 1.5 times the frequency $f_{bl}$ (line B)
(2N) $f_{ref}$, $T_{PER\_ref}$ Reference clock frequency and period length according to the 2N rule
(2N) $f_{CA}$, $T_{PER\_CA}$ Frequency and period length of the command signal CMD according to 2N rules
(4N) $f_{ref}$, $T_{PER\_ref}$ Frequency and period length of the reference clock according to the 4N rule
(4n) $f_{CA}$, $T_{PER\_CA}$ Frequency and period length of the command signal CMD according to the 4N rule
BL Burst length
ZB Additional bits
$f_{fd}=2$ $f_{bl}$ Double fundamental clock frequency

What is claimed is:

1. A semiconductor memory system, comprising:
at least one memory device including an interface circuit; and
a memory controller unit including an interface circuit coupled to the interface circuit of the least one memory device by data transfer lines;
wherein the data transfer lines are used to transfer, in signal bursts of a specific burst length, write and read data signals to and from the at least one memory device and from and to the memory controller unit, and wherein the interface circuits are configured to transfer additional bits (ZB) extending the burst length of at least the write data with at least every $n^{th}$ signal burst.

2. Semiconductor memory system as claimed in claim 1, further comprising a register unit including an interface circuit, wherein the data transfer lines are used to transfer, in signal bursts of a specific burst length, write and read data signals from and to the register unit.

3. Semiconductor memory system according to claim 1, wherein the additional bits are also transferred together with read data bursts.

4. Semiconductor memory system according to claim 1, wherein the interface circuits of the at least one memory device and memory control unit are configured with every signal burst.

5. Semiconductor memory system according to claim 1, wherein the interface circuits of the at least one memory device and memory control unit transfer the additional bits in a number that remains substantially the same.

6. Semiconductor memory system according to claim 1, wherein the additional bits comprise an error detection and/or correction code concerning an assigned data unit.

7. Semiconductor memory system according to claim 1, wherein the additional bits comprise a minimum number of edge changes for symbol synchronization.

8. Semiconductor memory system according to claim 7, wherein the additional bits include a specific synchronization pattern.

9. Semiconductor memory system according to claim 1, wherein the at least one memory device is a DDR-DRAM memory device.

10. A method for the transfer of write and read data signals among interface circuits provided in at least one memory device and a memory controller unit of a semiconductor memory system, comprising:
transferring the data signals in signal bursts of a specific burst length; and
transferring a number of additional bits extending the burst length at least of the write data bursts together with at least every $n^{th}$ signal burst.

11. Method for the transfer of write and read data signals according to claim 10, wherein additional bits are also transferred together with read data bursts.

12. Method for the transfer of write and read data signals according to claim 10, wherein the additional bits are transferred with every signal burst.

13. Method for the transfer of write and read data signals according to claim 10, wherein the number of additional bits remains the same for each burst.

14. Method for the transfer of write and read data signals according to claim 10, wherein the additional bits contain an error detection and/or correction code concerning an assigned data unit.

15. Method for the transfer of write and read data signals according to claim 10, wherein the additional bits contain a specific minimum number of edge transitions for symbol synchronization.

16. Method for the transfer of write and read data signals according to claim 15, wherein the minimum number of edge transitions is contained in successive additional bits.

17. Method for the transfer of write and read data signals according to claim 15, wherein the additional bits form a specific synchronization pattern.

18. Method for the transfer of write and read data signals according to claim 10, wherein the burst length is twenty including the additional bits.

19. Method for the transfer of write and read data signals according to claim 18, wherein the number of the additional bits contained in the burst is four.

* * * * *